(12) United States Patent
Nam et al.

(10) Patent No.: US 7,151,057 B2
(45) Date of Patent: Dec. 19, 2006

(54) FLEXIBLE MEMS TRANSDUCER MANUFACTURING METHOD

(75) Inventors: Yun-woo Nam, Yongin (KR); Suk-han Lee, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 227 days.

(21) Appl. No.: 10/669,360

(22) Filed: Sep. 25, 2003

(65) Prior Publication Data

US 2004/0147132 A1 Jul. 29, 2004

(30) Foreign Application Priority Data

Sep. 26, 2002 (KR) ............... 2002-0058316

(51) Int. Cl.
*H01L 21/302* (2006.01)

(52) U.S. Cl. ............ 438/754; 438/52; 438/458; 438/745; 257/254

(58) Field of Classification Search ........... 438/745, 438/750, 739, 52, 53, 458, 754; 257/254, 257/416
See application file for complete search history.

(56) References Cited

U.S. PATENT DOCUMENTS

| | | | |
|---|---|---|---|
| 5,789,264 A | 8/1998 | Chung | |
| 5,834,975 A * | 11/1998 | Bartlett et al. | 330/278 |
| 5,914,507 A * | 6/1999 | Polla et al. | 257/254 |
| 6,071,819 A | 6/2000 | Tai et al. | 438/694 |
| 6,245,444 B1 * | 6/2001 | Marcus et al. | 428/616 |
| 6,289,564 B1 | 9/2001 | Novotny | |
| 6,359,374 B1 | 3/2002 | Dausch et al. | |
| 6,670,212 B1 * | 12/2003 | McNie et al. | 438/52 |
| 6,677,709 B1 * | 1/2004 | Ma et al. | 313/504 |
| 2004/0061543 A1 | 4/2004 | Nam et al. | |

FOREIGN PATENT DOCUMENTS

| | | |
|---|---|---|
| CN | 1517296 | 8/2004 |
| JP | 08-205273 | 8/1995 |

OTHER PUBLICATIONS

French, et al., "Epi-micromachining", Microelectronics Journal. Mackintosh Publications Ltd., Luton, GB, vol. 28, No. 4, pp. 449-464 (May 1997).

* cited by examiner

*Primary Examiner*—Lan Vinh
(74) *Attorney, Agent, or Firm*—Lee & Morse, P.C.

(57) ABSTRACT

A method for manufacturing a flexible MEMS transducer includes forming a sacrificial layer on a flexible substrate, sequentially depositing a membrane layer, a lower electrode layer, an active layer, and an upper electrode layer on the sacrificial layer by PECVD, sequentially patterning the upper electrode layer, the active layer, and the lower electrode layer, depositing an upper protective layer to cover the upper electrode layer, the lower electrode layer, and the active layer, patterning the upper protective layer to be connected to the lower electrode layer and the upper electrode layer, and then depositing a connecting pad layer and patterning the connecting pad layer to form a first connecting pad to be connected to the lower electrode layer and a second connecting pad to be connected to the upper electrode layer; and patterning the membrane layer to expose the sacrificial layer and removing the sacrificial layer.

35 Claims, 7 Drawing Sheets

FLEXIBLE MEMS TRANSDUCER MANUFACTURING METHOD

BACKGROUND OF THE INVENTION

1. Field of the Invention

The present invention relates to a micro-electromechanical system (MEMS) structure. More particularly, the present invention relates to a MEMS transducer formed on a flexible substrate, a manufacturing method thereof and a flexible MEMS wireless microphone incorporating the MEMS transducer.

2. Description of the Related Art

As the need for very small devices increases, semiconductor processing technology using micromachining techniques is employed to integrate micro devices. The field of micro-electromechanical systems (MEMS) is a field of manufacturing and testing miniature sensors and actuators, which have sizes on the order of micrometers (μm), and electromechanical structures using micromachining technology applied in semiconductor processing, particularly, in integrated circuit technology.

The micromachining technology employed in the MEMS is largely divided into two categories. The first micromachining category is bulk micromachining by silicon bulk etching. The second micromachining category is surface micromachining by depositing a film of polycrystalline silicon, silicon nitride and silicon oxide on silicon and etching the deposited film according to a predetermined pattern to form a structure. For example, the formation of an ultra small microphone manufactured using a MEMS process is achieved using a diaphragm transducer formed by the bulk micromachining technology.

FIG. 1 illustrates a cross-sectional view of a conventional MEMS transducer. As shown in FIG. 1, the conventional MEMS transducer includes a diaphragm layer of silicon nitride, a $SiO_2$ layer coated by a chemical vapor deposition (CVD) process, a piezo film of zinc oxide (ZnO) and an upper electrode and a lower electrode on a silicon wafer (Si). The CVD process to form a silicon nitride thin film and silicon oxide layer on the silicon wafer is a high temperature process requiring a process temperature of about 780° C. to 850° C. Therefore, it is impossible to use a flexible polymeric material other than the silicon wafer as a material for the substrate.

Meanwhile, as the information communication industry develops, demand for a hand-held or wearable information terminal is similarly increasing. This increase in demand is due in part to the applications of such information terminals being implemented into diverse fields, such as medical, service, entertainment, military, and information communication. For convenience in using these information terminals, the components of these terminals should have excellent characteristics in terms of mobility and wearability. In particularly, in order to realize a wearable system, a flexible system structure is essential. Therefore, a technology to integrate a functional structure and other electric parts together on a flexible substrate is needed.

As a flexible substrate, metallic thin films or polymeric materials are used. Polymeric materials are more suitable for use in an electronic system. Polymeric materials, however, have a low melting point in the range of 500° C. or less. Thus, when polymeric materials are subjected to a process for forming a thin film at a high temperature, the polymeric materials deteriorate. Therefore, polymeric materials are not suitable for use as a material for the substrate, such as a wafer, in a process for manufacturing MEMS, which requires a process temperature that is higher than the melting point of the polymeric materials. In practice, silicon MEMS and semiconductors, which are widely used and have excellent characteristics in terms of performance and degree of integration, are generally produced by methods including a high temperature process of at least 500° C. Therefore, the substrate of a high molecular (polymeric) material, which is needed for a flexible system structure, cannot be used.

Specifically, a conventional MEMS structure is formed by depositing a thin film on a substrate by chemical vapor deposition (CVD), followed by an etching process. However, since a very high temperature is needed to form a high-utility thin film by CVD, a low-melting point substrate, such as a polymer, glass, and the like, cannot be used.

In order to overcome such problems, as shown in FIG. 2, a conventional method produces a flexible device by forming a sensor device 30 on a silicon substrate 10 using a silicon MEMS process, cutting between silicon islands from a backside of the silicon substrate 10 and then depositing a polymer 11. However, this method has disadvantages in that the conventional silicon MEMS process adopting a high temperature process is used and a polymer process is additionally performed in a final step, thereby increasing the complexity and the cost of the entire manufacturing process.

SUMMARY OF THE INVENTION

The present invention has been developed in order to solve at least some of the above-described problems in the prior art. Accordingly, it is an aspect of the present invention to provide a microphone, which has characteristics of softness, flexibility and foldability, by forming a MEMS transducer structure on a flexible polymer substrate using a plasma enhanced chemical vapor deposition (PECVD) process.

The above aspect of the present invention is achieved by providing a method for manufacturing a flexible MEMS transducer including forming a sacrificial layer on a flexible substrate; sequentially depositing a membrane layer, a lower electrode layer, an active layer, and an upper electrode layer on the sacrificial layer by plasma enhanced chemical vapor deposition (PECVD); sequentially patterning the upper electrode layer, the active layer, and the lower electrode layer; depositing an upper protective layer to cover the upper electrode layer, the lower electrode layer, and the active layer; patterning the upper protective layer to be connected to the lower electrode layer and the upper electrode layer, and then depositing a connecting pad layer and patterning the connecting pad layer to form a first connecting pad to be connected to the lower electrode layer and a second connecting pad to be connected to the upper electrode layer; and patterning the membrane layer to expose the sacrificial layer and removing the sacrificial layer.

It is preferred that the substrate is formed of a flexible high molecular material, such as polyimide, or is formed of polymer or metallic thin film.

Preferably, the method for manufacturing a flexible MEMS transducer further includes forming a lower protective layer by depositing either silicon nitride or silicon oxide on the flexible substrate, before depositing the sacrificial layer on the flexible substrate.

Preferably, forming the sacrificial layer is performed by coating a polyimide layer on the substrate and patterning the coated polyimide layer by either a wet etching or a dry etching in accordance with a configuration of the membrane layer.

Preferably, the membrane layer is formed by depositing silicon nitride to a thickness of less than about 5 µm by PECVD.

Preferably, the upper electrode layer and the lower electrode layer are formed of a material selected from the group consisting of metals and electrically conductive polymers and have thickness of between about 0.01 µm to 5 µm. Preferably, the first connecting pad and the second connecting pad are formed of a material selected from the group consisting of metals and electrically conductive polymers.

Preferably, the active layer is formed by depositing a piezopolymer such as PVDF, PVDF-TrEF, TrEF, Polyurea, polyimide and Nylon by a spin coating or an evaporation on the lower electrode. In here, the active layer is formed to a thickness of between about 1 µm to 10 µm, has a length of between about 50 µm to 1000 µm, and has a resonance frequency of between about 1 Hz to 100 kHz.

Preferably, patterning the membrane layer is performed by a dry etching, and patterning the active layer is performed by either a wet etching or a dry etching.

Preferably, the upper protective layer is formed by depositing either silicon nitride and silicon oxide by PECVD to a thickness of between about 1 µm to 10 µm. Preferably, patterning the upper protective layer is performed by either a wet etching or a dry etching.

BRIEF DESCRIPTION OF THE DRAWINGS

The above and other aspects and advantages of the present invention will become more apparent to those of ordinary skill in the art by describing in detail preferred embodiments thereof with reference to the attached drawings in which.

DETAILED DESCRIPTION OF THE INVENTION

Figure 1:
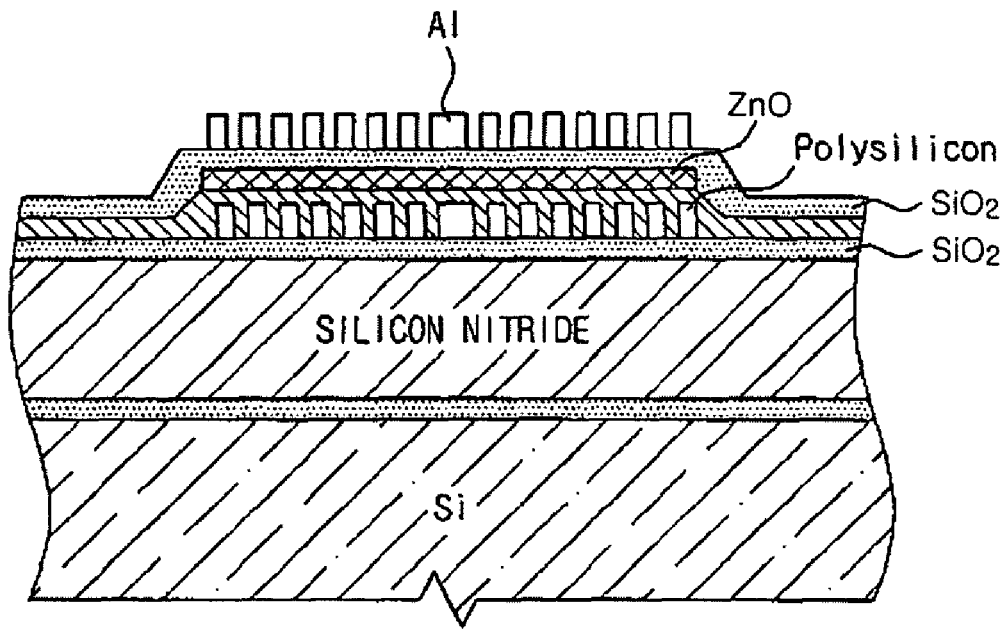
FIG. 1 illustrates a cross-sectional view of a conventional MEMS transducer.
Figure 2:
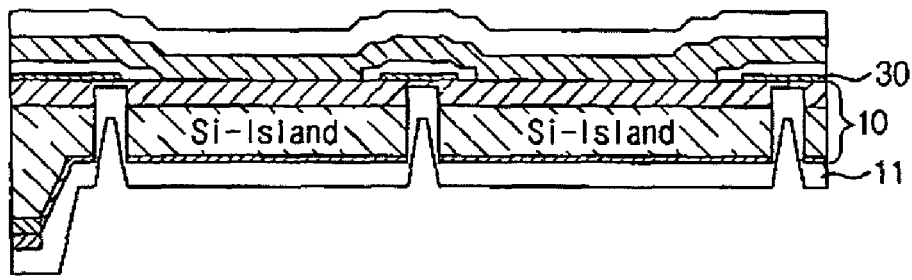
FIG. 2 illustrates a cross-sectional view of a conventional flexible MEMS sensor.

Korean Patent Application No. 2002-58316, filed on Sep. 26, 2002, and entitled: "Flexible MEMS Transducer Manufacturing Method," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 3:
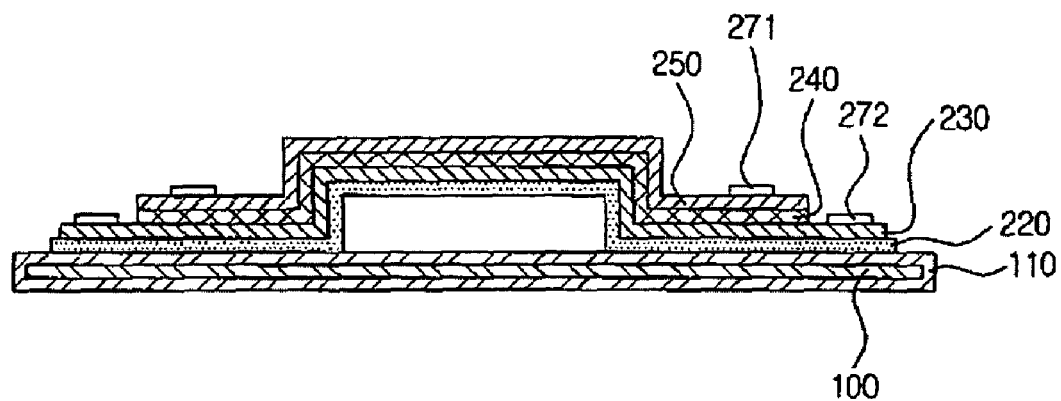
FIG. 3 illustrates a cross-sectional view of a diaphragm-type transducer according to an embodiment of the present invention.
Figure 4:
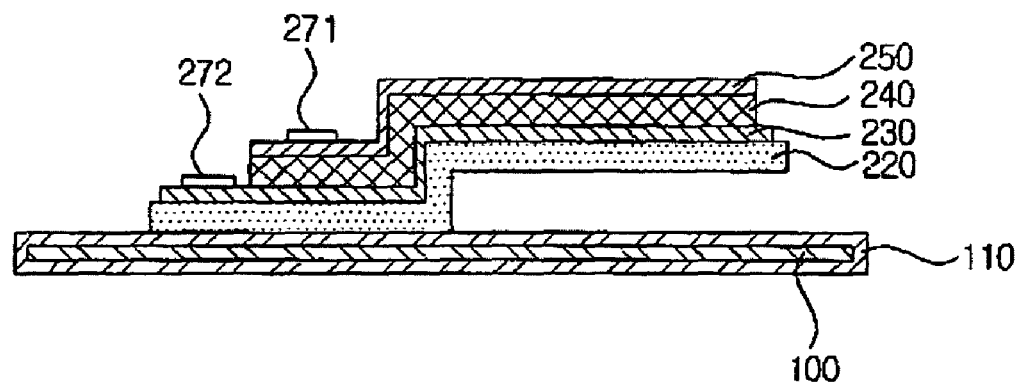
FIG. 4 illustrates a cross-sectional view of a cantilever-type transducer according to an embodiment of the present invention.

FIG. 3 illustrates a cross-sectional view of a diaphragm-type flexible transducer according to an embodiment of the present invention. FIG. 4 illustrates a cross-sectional view of a cantilever-type transducer according to an embodiment of the present invention. As shown in FIGS. 3 and 4, a transducer according to an embodiment of the present invention includes a flexible substrate 100, on which a lower protective layer 110 has been formed by depositing either silicon nitride or silicon oxide by Plasma Enhanced Chemical Vapor Deposition (PECVD) or by sputtering, and a transducer structure including a membrane layer 220 formed by PECVD, which is performed at a low temperature, a lower electrode layer 230, an active layer 240, which is preferably a piezopolymer active layer, an upper electrode layer 250 and connecting pads 271 and 272. In the case of a diaphragm-type or a cantilever-type transducer, a sacrificial layer is formed on the substrate 100, the membrane layer 220 is deposited on the sacrificial layer, and then the sacrificial layer is removed by an etchant in order to form a raised part on the membrane layer 220. More specifically, in the case of a cantilever-type transducer, the removal of the sacrificial layer is performed by removing the sacrificial layer from an open side, and in case of a diaphragm-type transducer, the removal is performed by forming predetermined passage holes on the raised part of the membrane layer 220 by etching and injecting an etchant through the passage holes.

FIGS. 5A to 5J sequentially illustrate stages in a process for manufacturing the cantilever-type flexible transducer according to a preferred embodiment of the present invention. The exemplary transducer shown in the figures is a cantilever-type, and an exemplary process for manufacturing a cantilever-type transducer will now be explained with reference to FIGS. 5A to 5J.

Figure 5A:
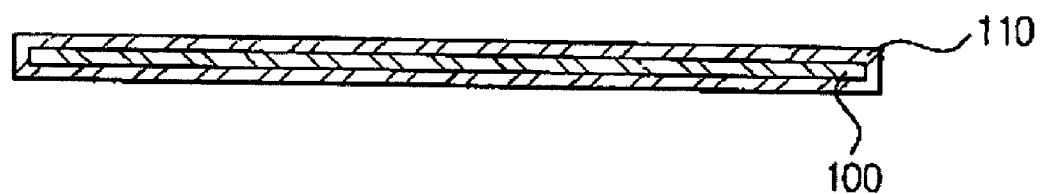
FIGS. 5A through 5J illustrate cross-sectional views of stages in a fabrication process of the cantilever-type transducer of FIG. 4.

As shown in FIG. 5A, the manufacturing process of the flexible transducer starts with coating a lower protective layer 110 on a flexible substrate 100. As a material for the substrate 100, a flexible material is used. This flexible material may include a high-molecular (polymeric) material, such as polymer or polyimide, or a metallic thin film. A high-molecular material is the preferred material for use in an electronic system, such as a microphone. The lower protective layer 110 is formed by coating silicon nitride or silicon oxide by PECVD or sputtering. Preferably, the lower protective layer 110 has a thickness of less than about 10 µm. By using the PECVD or sputtering process, it is possible to perform the process at a low-temperature of about 400° C. or less. The lower protective layer 110 functions to protect the substrate 100 and to facilitate the adhesion of layers, which will be subsequently deposited.

Figure 5B:
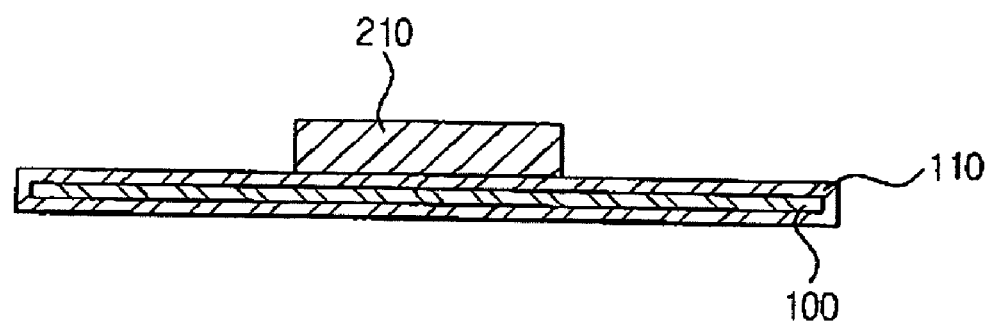

As shown in FIG. 5B, on the flexible substrate 100 on which the lower protective layer 110 is coated, a sacrificial layer 210 is deposited which will be used to form a membrane layer provided with a raised part. The sacrificial layer 210 is formed by coating a polyimide to a thickness of less than about 10 µm and then patterning the polyimide in accordance with a desired configuration of the membrane layer.

Figure 5C:
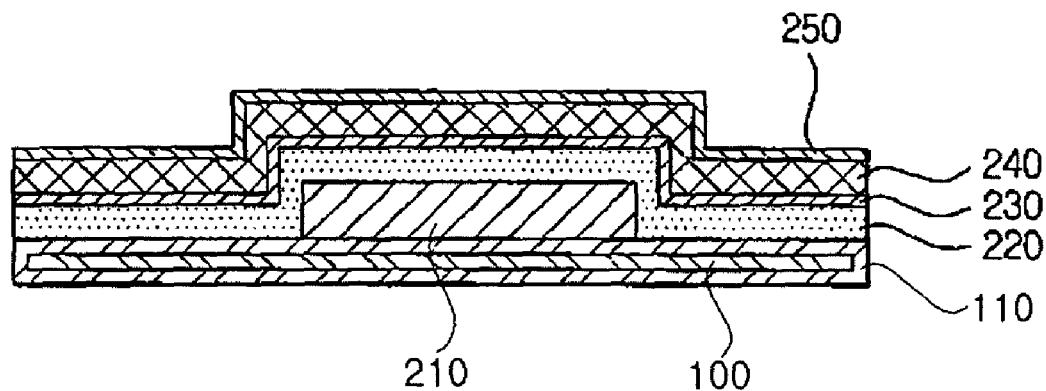

Referring now to FIG. 5C, on the patterned sacrificial layer 210, a membrane layer 220 is deposited. The membrane layer 220 is formed by coating silicon nitride by PECVD in a low temperature process. Preferably, the membrane layer 220 has a thickness of less than about 5 µm. Then, a lower electrode layer 230 is deposited on the membrane layer 220. An active layer 240 is then coated on the lower electrode layer 230. The active layer 240 is formed by coating a piezopolymer, such as PVDF, PVDF-TrEF, TrEF, Polyurea, polyimide, Nylon or the like, by spin coating or evaporation. Preferably, the active layer 240 has a thickness of between about 1 μm to 10 μm and a length of between about 50 μm to 1000 μm. Preferably, the active layer 240 has a resonance frequency of between about 1 Hz to 100 kHz. An upper electrode layer 250 is then deposited on the piezopolymer active layer 240. The lower electrode layer 230 and the upper electrode layer 250 are formed by depositing a metal, such as aluminum, or an electrically conductive polymer. Preferably, each of the lower electrode layer 230 and the upper electrode layer 250 has a thickness of between about 0.01 μm to 5 μm.

Figure 5D:
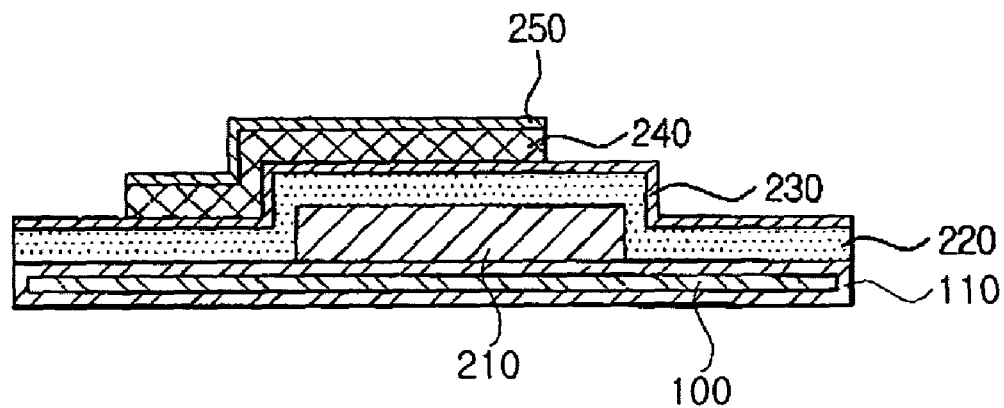
Figure 5E:
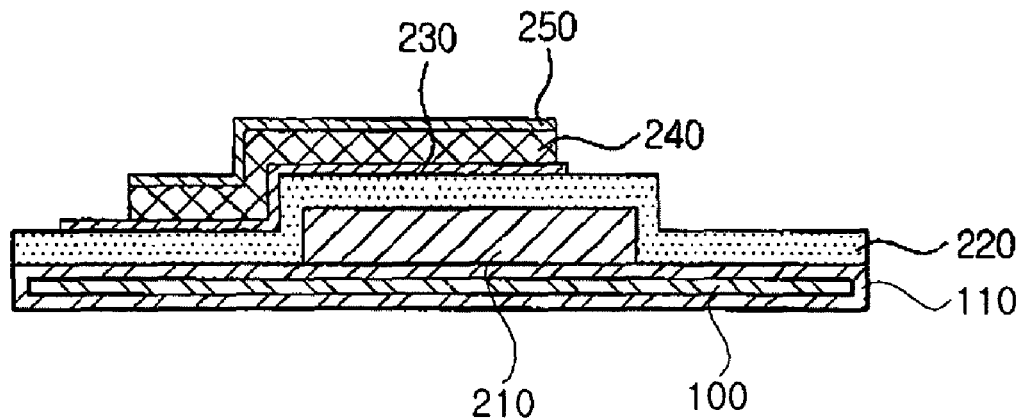

In FIG. 5D, the upper electrode layer 250 and the active layer 240 are patterned by either wet etching or dry etching. In FIG. 5E, the lower electrode layer 230 is patterned by either wet etching or dry etching.

Figure 5F:
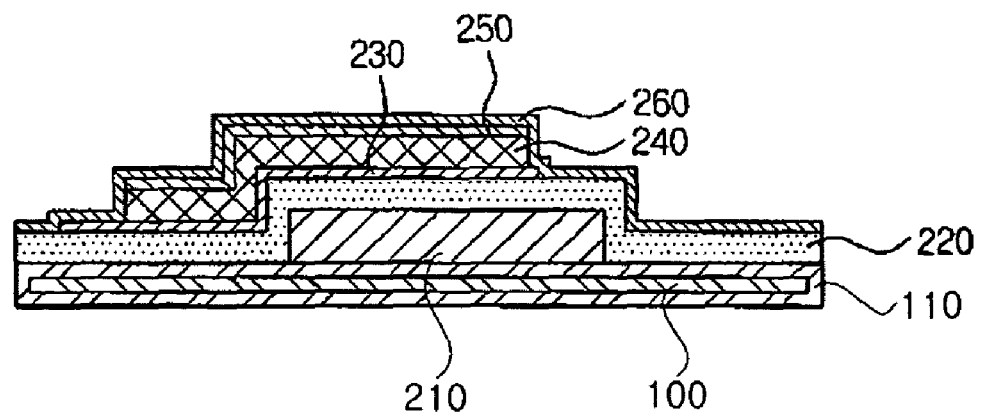
Figure 5G:
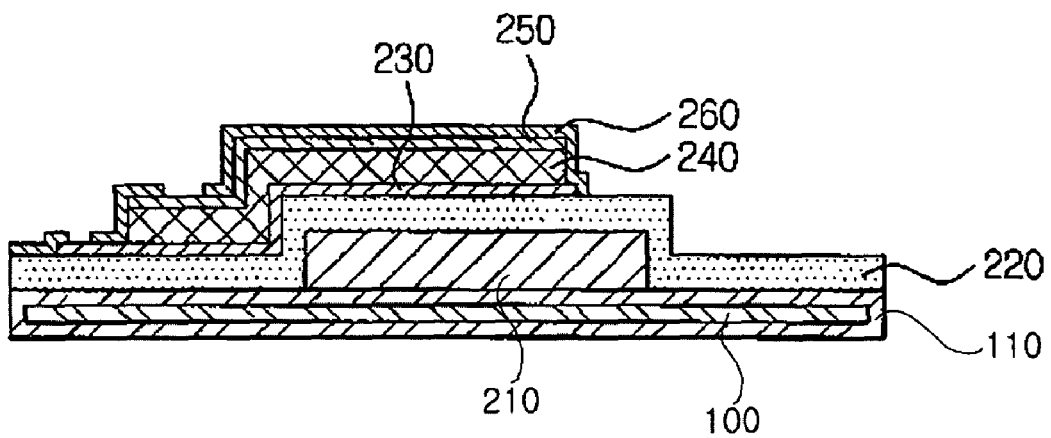

Next, in FIG. 5F, an upper protective layer 260 is formed so that the piezopolymer active layer 240 is protected during the removal of the sacrificial layer 210 by etching. The upper protective layer 260 is formed by depositing silicon nitride or silicon oxide to a thickness of about 1 μm to 10 μm by PECVD to cover the upper and lower electrode layers 230 and 250 and the active layer 240. In FIG. 5G, the upper protective layer 260 is patterned by either wet etching or dry etching.

Figure 5H:
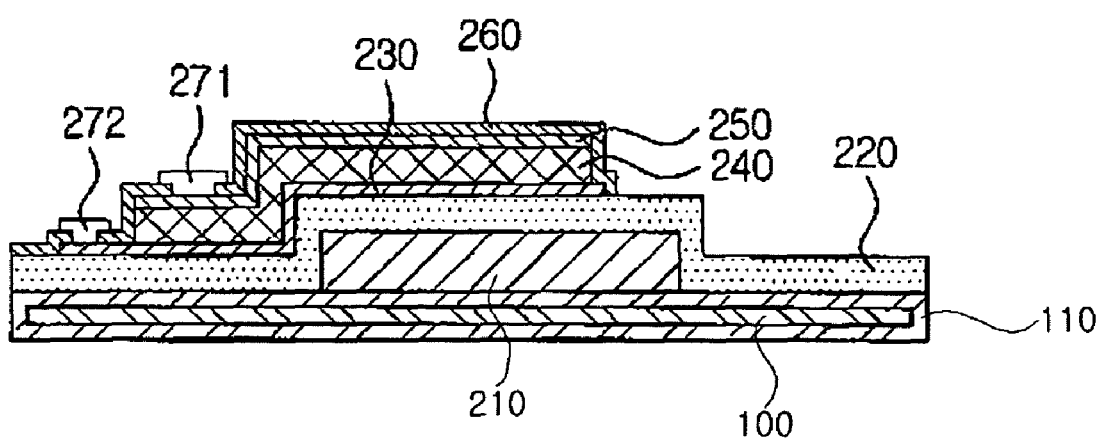

After forming the upper protective layer 260, in FIG. 5H, connecting pads 271 and 272 are formed to be electrically connected to the upper electrode layer 250 and the lower electrode layer 230, respectively. The connecting pads 271 and 272 are formed by patterning the upper protective layer 260 at portions to be connected to the upper and lower electrode layers 250 and 230, respectively, by either wet etching or dry etching, and by coating a metal, such as aluminum, or an electrically conductive polymer thereon.

Figure 5I:
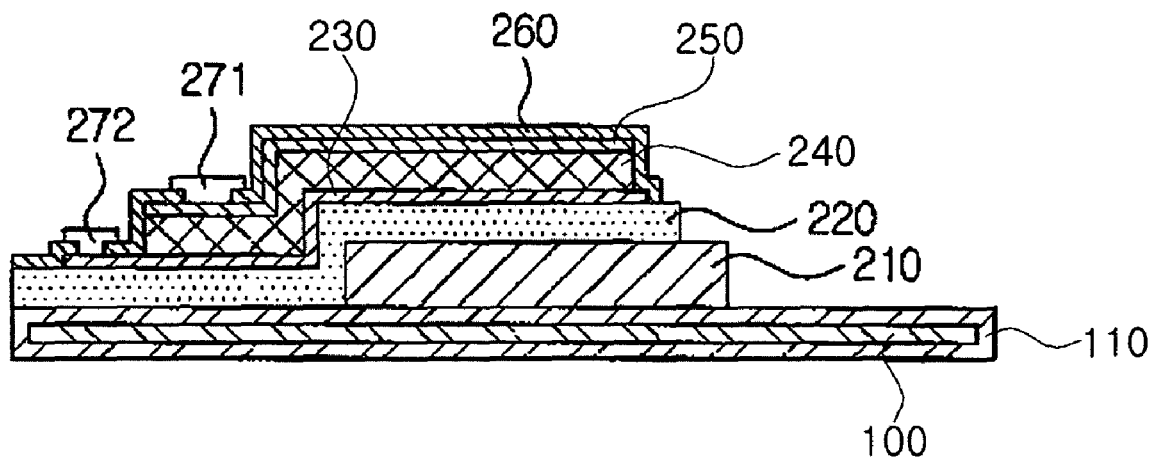
Figure 5J:
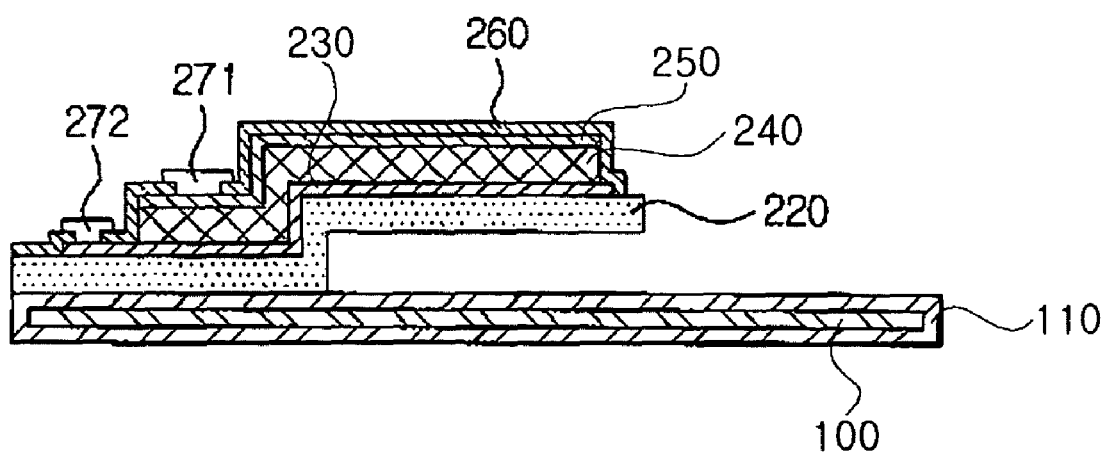

Finally, as shown in FIGS. 5I and 5J, after patterning the membrane layer 220 to expose the sacrificial layer 210, the sacrificial layer 210 is removed by dry etching through the injection of an etchant, thereby completing the formation of the flexible cantilever-type MEMS transducer.

According to the above-described manufacturing method, it is possible to form a transducer structure 200 on a flexible substrate 100, such as a polymer, by using a low-temperature process, such as PECVD. Thus, in the transducer structure 200 according to an embodiment of the present invention, the deposition of thin layers is performed by using PECVD or sputtering instead of CVD, which requires a high temperature process of about 780° C. to 850° C. The reason for this difference in required temperature levels is related to the energy source used in the respective processes. Specifically, the PECVD process uses plasma as an energy source needed for reaction, whereas the conventional CVD process uses heat energy. Therefore, the heat energy can be reduced and thin layers can be formed at a low temperature in PECVD. More particularly, it is possible to deposit thin layers constituting the transducer structure 200 at a low temperature thereby permitting use of a flexible polymeric substrate 100. Consequently, according to the present invention, a flexible microphone of soft material can be manufactured.

Since the substrate 100, on which the flexible MEMS transducer is formed, has paper-like features, it can be cut and folded in accordance with a desired three-dimensional structure of the microphone to be packaged and assembled into the desired three-dimensional structure for packaging. Accordingly, the present invention provides a highly flexible microphone.

In particular, a microphone structure according to an embodiment of the present invention is flexible and foldable due to the use of a flexible polymeric substrate. Accordingly, it is possible to package the microphone into a desired three-dimensional structure by cutting and folding the substrate laminated with other elements in accordance with the desired three-dimensional structure and assembling it into a three-dimensional microphone.

As described above, according to the present invention, since a transducer structure can be prepared by a low-temperature process, a flexible polymer substrate can be used. Thus, it is possible to produce a flexible microphone system having excellent characteristics in terms of degree of integration, mobility, softness, flexibility, foldability and wearability by a simple process at a low temperature and at a reduced cost.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for manufacturing a flexible MEMS transducer, comprising:
    forming a sacrificial layer on a flexible substrate of the flexible MEMS transducer;
    sequentially depositing a membrane layer, a lower electrode layer, an active layer, and an upper electrode layer on the sacrificial layer by plasma enhanced chemical vapor deposition (PECVD);
    sequentially patterning the upper electrode layer, the active layer, and the lower electrode layer;
    depositing an upper protective layer to cover the upper electrode layer, the lower electrode layer, and the active layer;
    patterning the upper protective layer to be connected to the lower electrode layer and the upper electrode layer, and then depositing a connecting pad layer and patterning the connecting pad layer to form a first connecting pad to be connected to the lower electrode layer and a second connecting pad to be connected to the upper electrode layer; and
    patterning the membrane layer to expose the sacrificial layer and removing the sacrificial layer.

2. The method as claimed in claim 1, wherein the substrate is formed of a flexible high molecular material.

3. The method as claimed in claim 1, wherein the substrate is formed of a material selected from the group consisting of polymer, polyimide, and metallic thin film.

4. The method as claimed in claim 1, further comprising:
    forming a lower protective layer by depositing either silicon nitride or silicon oxide on the flexible substrate, before depositing the sacrificial layer on the flexible substrate.

5. The method as claimed in claim 4, wherein the lower protective layer is formed by either PECVD or sputtering.

6. The method as claimed in claim 5, wherein the lower protective layer is formed at a temperature of less than about 400° C.

7. The method as claimed in claim 4, wherein the lower protective layer has a thickness of less than about 10 μm.

8. The method as claimed in claim 1, wherein forming the sacrificial layer is performed by coating a polyimide layer on the substrate and patterning the coated polyimide layer by either a wet etching or a dry etching in accordance with a configuration of the membrane layer.

9. The method as claimed in claim 1, wherein the sacrificial layer is formed to a thickness of less than about 10 μm.

10. The method as claimed in claim 1, wherein the membrane layer is formed of silicon nitride.

11. The method as claimed in claim 1, wherein the membrane layer is deposited using PECVD.

12. The method as claimed in claim 1, wherein the membrane layer has a thickness of less than about 5 μm.

13. The method as claimed in claim 1, wherein patterning the membrane layer is performed by a dry etching.

14. The method as claimed in claim 1, wherein the upper electrode layer and the lower electrode layer are formed of a material selected from the group consisting of metals and electrically conductive polymers.

15. The method as claimed in claim 1, wherein the first connecting pad and the second connecting pad are formed of a material selected from the group consisting of metals and electrically conductive polymers.

16. The method as claimed in claim 1, wherein the lower electrode layer has a thickness of between about 0.01 μm to 5 μm.

17. The method as claimed in claim 1, wherein the upper electrode layer has a thickness of between about 0.01 μm to 5 μm.

18. The method as claimed in claim 1, wherein the active layer is formed by depositing a piezopolymer on the lower electrode layer.

19. The method as claimed in claim 18, wherein the piezopolymer is deposited by one of a spin coating and an evaporation.

20. The method as claimed in claim 18, wherein the piezopolymer is selected from the group consisting of PVDF, PVDF-TrEF, TrEF, Polyurea, polyimide and Nylon.

21. The method as claimed in claim 1, wherein the active layer is formed to a thickness of between about 1 μm to 10 μm.

22. The method as claimed in claim 1, wherein the active layer has a resonance frequency of between about 1 Hz to 100 kHz.

23. The method as claimed in claim 1, wherein the active layer has a length of between about 50 μm to 1000 μm.

24. The method as claimed in claim 1, wherein patterning the active layer is performed by either a wet etching or a dry etching.

25. The method as claimed in claim 1, wherein the upper protective layer is formed of either silicon nitride or silicon oxide.

26. The method as claimed in claim 1, wherein the upper protective layer has a thickness of between about 1 μm to 10 μm.

27. The method as claimed in claim 1, wherein the upper protective layer is deposited using PECVD.

28. The method as claimed in claim 1, wherein patterning the upper protective layer is performed by either a wet etching or a dry etching.

29. The method as claimed in claim 1, wherein the PECVD includes heating to a temperature not exceeding about 400° C.

30. The method as claimed in claim 1, wherein the active layer is a polymeric piezoelectric layer.

31. A method of manufacturing a MEMS device on a flexible substrate, comprising:
  providing a flexible substrate having a substantially planar surface; and
  forming a MEMS device on the planar surface, wherein forming the MEMS device includes:
    forming a sacrificial layer on the planar surface, the sacrificial layer having a lower surface facing the planar surface and an upper surface spaced above the planar surface by a predetermined distance, the upper surface parallel to the lower surface;
    depositing a membrane layer on the planar surface and on the sacrificial layer;
    forming an actuator on the membrane layer;
    exposing a portion of the sacrificial layer; and
    removing the sacrificial layer, wherein removing the sacrificial layer leaves a cavity defined in part by the planar surface and in part by the membrane layer.

32. The method of manufacturing a MEMS device on a flexible substrate as claimed in claim 31, wherein the sacrificial layer has a side surface extending from the lower surface to the supper surface, and wherein the side surface is not covered by the membrane layer.

33. The method of manufacturing a MEMS device on a flexible substrate as claimed in claim 32, wherein a first side of the cavity is defined by the membrane layer and the cavity has an open side opposite the first side.

34. The method of manufacturing a MEMS device on a flexible substrate as claimed in claim 31, wherein forming the actuator includes forming a lower electrode layer, an active layer and an upper electrode layer on the sacrificial layer by a vapor deposition process, and wherein forming the lower electrode layer, the active layer and the upper electrode layer includes heating to a temperature not exceeding about 400° C.

35. The method of manufacturing a MEMS device on a flexible substrate as claimed in claim 31, wherein the flexible substrate is a polymer, a polyimide, or a metallic thin film.

* * * * *